US006673265B1

(12) United States Patent
Nguyen (10) Patent No.: US 6,673,265 B1
(45) Date of Patent: Jan. 6, 2004

(54) ANTIMONY-BASED HETEROSTRUCTURE VARACTOR DIODE WITH BANDGAP ENGINEERED QUANTUM WELL ELECTRODES

(75) Inventor: Chanh Nguyen, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/632,272

(22) Filed: Aug. 3, 2000

(51) Int. Cl.[7] ............... H01L 31/0328; H01L 31/109; H01L 29/06; H01L 29/93; H01L 31/072
(52) U.S. Cl. ............... 252/183; 257/200; 257/201; 257/11; 257/12; 257/14; 257/191; 257/480
(58) Field of Search ............... 257/183, 200, 257/201, 480, 11, 12, 14, 191

(56) References Cited

U.S. PATENT DOCUMENTS

| | | | |
|---|---|---|---|
| 4,142,924 A | | 3/1979 | Hsieh |
| 4,504,329 A | | 3/1985 | Quinlan et al. |
| 5,113,231 A | * | 5/1992 | Soderstrom et al. ........ 257/197 |
| 5,145,809 A | * | 9/1992 | Walker ............... 148/DIG. 135 |
| 5,278,444 A | * | 1/1994 | Lieneweg et al. ............ 257/15 |
| 5,302,838 A | | 4/1994 | Roenker et al. |
| 5,405,797 A | * | 4/1995 | Brugger ...................... 438/172 |
| 5,408,107 A | * | 4/1995 | Neikirk et al. ................ 257/17 |
| 6,121,102 A | * | 9/2000 | Norstrom et al. ........... 438/361 |

OTHER PUBLICATIONS

Capacitance Engineering for InP–Based Heterostructure Barrier Varactor, E. Lheurette et al., IEEE Electron Device Letters, vol. 19, No. 9, Sep. 1998. See whole document.*

Heterostructure Barrier Quantum Well Varactor□□V. Duez et al., IEEE Electron Device Letters. See whole document.*

Havart, R., et al. "Step–Like heterostructure barrier varactor" IEEE Transactions on Electron Devices, IEEE Inc. New York, US, vol. 45, No. 11, Nov. 1, 1998, pp. 2291–2297, XP000785570.

Crowe, T.W., et al. "Progress toward solid–state local oscillators at 1 THZ" IEEE Microwave and Guided Wave Letters, IEEE Inc., New York, US, vol.6, No. 5, May 1, 1996, pp. 207–208, XP000583594.

E. Kollberg and A. Rydberg, "Quantum Barrier Varactor Diode for High Efficiency Millimeter–Wave Multipliers", Electron Lett., vol. 25, p. 1969, 1989.

R.Havart,E. Lheurette, O. Vanbesien, P.Mounaix,F.Mollot, And D. Lippens,"Step–like Heterostructure Barrier Varactor", IEEE Trans. Elect. Dev., vol. 45, p. 2291, 1988.

T. Crowe, T. Grein, R. Zimmermann, andP. Zimmermann, "Progress Toward Solid–State Local Oscillators at 1 THz", IEEE Microwave and Guided Wave Letters, vol. 6, No. 5, May 1996, p. 207, 1996.

\* cited by examiner

Primary Examiner—Hoai Ho
Assistant Examiner—Ly Duy Pham
(74) Attorney, Agent, or Firm—Tope-McKay & Associates (57) ABSTRACT

The present invention provides a varactor diode for frequency multipliers at submillimeter wave frequencies and above. Functionally the new diode replaces the conventional heterostructure barrier varactor diode. Two important features of the antimony-based quantum well heterostructure barrier varactor are; first: an aluminum antimnide/aluminum-arsenic-antimnide heterostructure barrier and second: a bandgap-engineered, triangular quantum well cathode and anode.

11 Claims, 8 Drawing Sheets

ANTIMONY-BASED HETEROSTRUCTURE VARACTOR DIODE WITH BANDGAP ENGINEERED QUANTUM WELL ELECTRODES

TECHNICAL FIELD

This invention relates generally to varactor diodes. More specifically, the invention pertains to varactor diodes for frequency multipliers at, and above, submillimeter-wave frequencies.

BACKGROUND OF THE INVENTION

An electronic circuit that produces an output frequency that is an integral multiple of the input frequency is known as a frequency multiplier. One type of frequency multiplier uses the nonlinear capacitance of a semiconductor PN junction diode to couple energy from an input circuit that is tuned to a fundamental input frequency to an output circuit, which is tuned to a desired harmonic of the input frequency. A semiconductor junction device that has a nonlinear capacitance is known as a varactor. The basic physics of the varactor is described in S. M. Sze, Physics of Semiconductor Devices, 2nd Edition, Wiley 1981, pp. 114–116.

In essence, a varactor diode is a diode that can behave as a capacitor in the presence of a reverse voltage. When a reverse voltage is applied to a PN junction, the holes in the p-region are attracted to the anode terminal and electrons in the n-region are attracted to the cathode terminal. The resulting depletion region, between the anode and the cathode, is substantially devoid of carriers, and behaves as the dielectric of a capacitor.

The depletion region widens as the reverse voltage across it increases; and since capacitance is inversely proportional to dielectric thickness, the capacitance will decrease as the reverse voltage across the PN junction increases. Therefore by varying the reverse voltage across a PN junction the junction capacitance can be varied. Variations in reverse voltage have a non-linear effect on capacitance. It is this nonlinearity that allows the varactor to be used as a harmonic generator.

Frequency multipliers that provide consistent and dependable power at submillimeter wave frequencies are highly desirable for a variety of applications including; space and upper atmosphere imaging, sensing and communication applications. Terahertz satellite communication links can also support data transfer rates exceeding the capabilities of existing microwave systems. Thus a growing number of millimeter-wave applications has created a need for local-oscillator sources operating at terahertz frequencies. T. W. Crowe and T. C. Grein at the University of Virginia (Charlottesville, Va.) and R. Zimmermann and P. Zimmermann at Radiometer Physics GmbH (Meckenheim, Germany) disclose a tripler design that utilizes whisker-contacted, Schottky-barrier varactor (SBV) diodes to deliver an 800-GHz output frequency. See *Progress Toward Solid-State Local Oscillators at 1 THz*, IEEE Microwave and Guided Wave Letters, Vol. 6, No. May 5, 1996, p. 207, 1996. Also see E. Kollberg and A Rydberg, *Quantum Barrier Varactor Diode For High Efficiency Millimeter- Wave Multipliers*, Electron Lett. Vol. 25, p. 1969, 1989: Demonstrating GaAs/AlGaAs heterostructure barrier varactor with symmetric C–V profile. The type of device referred to in this article suffers form high leakage current due to a low barrier height. Additionally R. Havart, E. Lheurette, O. Vanbesien, P. Mounaix, F. Mollot, and D. Lippens, in *Step-like Heterostructure Barrier Varactor*, IEEE Trans. Elect. Dev. Vol. 45, p. 2291, 1988 report that AlInAs/AlAs/AlInAs heterostructure barrier has an improved leakage current.

SUMMARY OF THE INVENTION

Therefore, an object of the present invention is to provide a method and apparatus that improves the efficiency of a frequency multiplier so as to decrease the power loss arising during the frequency multiplication.

This invention provides a novel varactor diode for frequency multipliers at submillimeter wave frequencies and above. Functionally, this device replaces the conventional heterostructure barrier varactor. The two essential features of this Sb-based quantum well heterostructure barrier varactor are (1) the AlSb/AlAsSb heterostructure barrier and (2) bandgap engineered triangular quantum well cathode and anode.

BRIEF DESCRIPTION OF THE DRAWINGS

The objects, features, and advantages of the present invention will be apparent from the following detailed description of the preferred embodiment of the invention with references to the following drawings.

DESCRIPTION OF THE PREFERRED EMBODIMENTS

An object of the present invention is to provide a method and an apparatus that improves the efficiency of a frequency multiplier so as to decrease the power loss that arises during frequency multiplication. The present invention is directed toward a method and apparatus related to varactor diodes and their manufacture and may be tailored to a variety of other applications. The following description is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In part, a varactor diode is herein described, with application for frequency multipliers at submillimeter wave frequencies and above. Functionally, the invented device may replace the conventional heterostructure barrier varactor. The invention specifically pertains to an Sb-based quantum well heterostructure barrier varactor having an AlSb/AlAsSb heterostructure barrier and a bandgap engineered triangular quantum well cathode and anode.

Varactors are used in frequency multiplication applications to generate power at submillimeter wave frequencies. Currently, the highest $f_{max}$ achieved with 3-terminal device is still below 1 THz. Therefore, an attractive approach to generate power above 1 THz is to up-convert power generated at a lower frequency using a frequency multiplier. The two devices that are most popular for this purpose are heterostructure barrier varactor (HBV) and Schottky diode varactor (SDV). The HBV has a symmetric capacitance-voltage (C–V) profile with higher $C_{max}/C_{min}$ capacitance ratio and higher non-linearity than SDV that result in more efficient triplers and quintuplers at high frequencies. However, the leakage current of conventional HBVs is much higher than the leakage current of reversed biased SDVs, therefore limiting its efficiency and output power. The Sb-based quantum well heterostructure barrier varactor disclosed herein has a significantly reduced leakage current. The reduced leakage current is partially due to the suppression of electron tunneling through, and thermionic emission over, the AlSb/AlAsSb heterostructure barrier. The leakage current is the same or lower than that of a reversed biased Schottky diode varactor. Additionally, the advantages of a symmetric C–V profile, high non-linearity and high capacitance ratio associated with HBV are retained. Furthermore, in the quantum heterostructure barrier varactor (QHBV), both the non-linearity and capacitance ratio are significantly enhanced by novel bandgap engineered quantum well electrodes.

Figure 1:
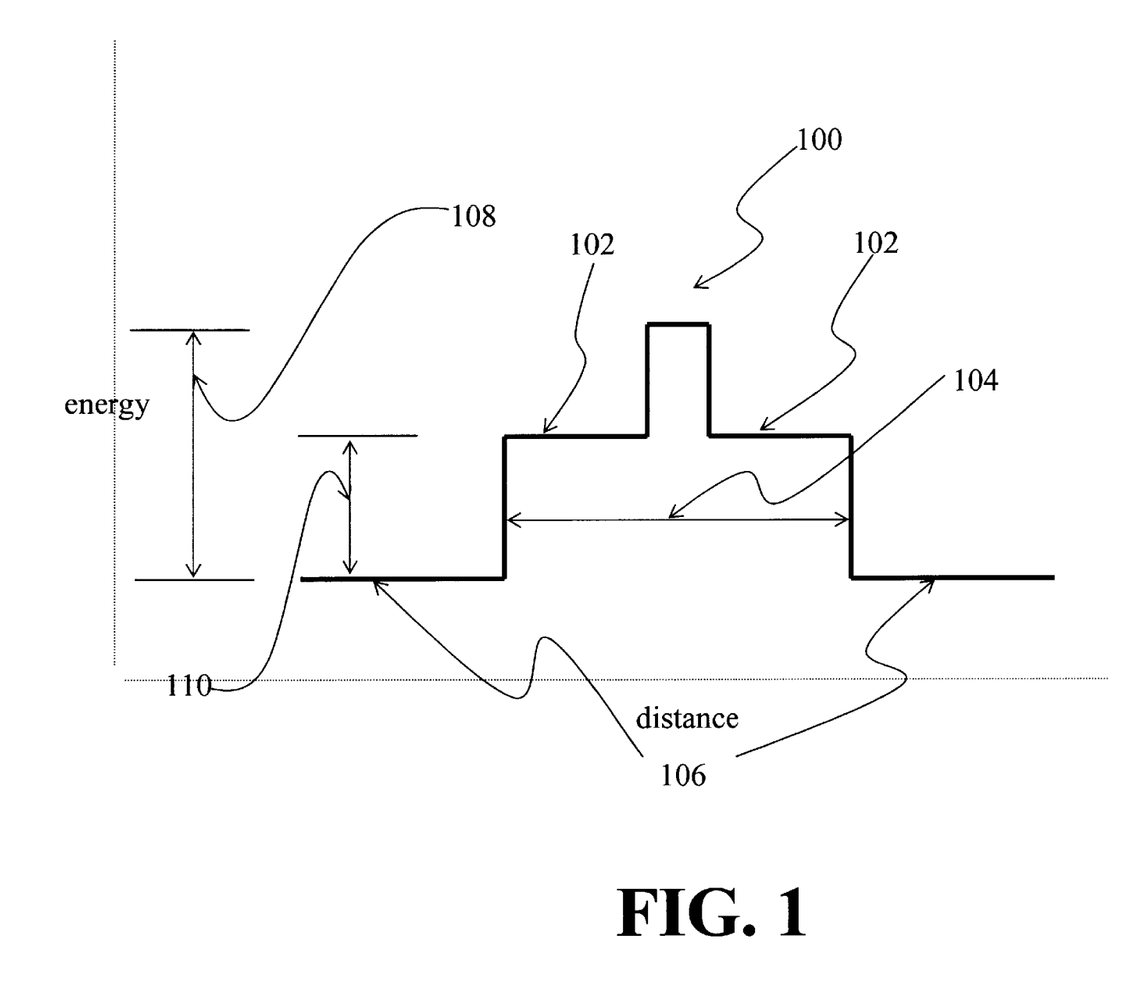
FIG. 1 shows the conduction band diagram of an HBV on an InP substrate. The structure essentially consists of a thin AlAs (Aluminum-Arsenic) layer sandwiched between two thicker AlInAs layers lattice matched to InP.
Figure 2:
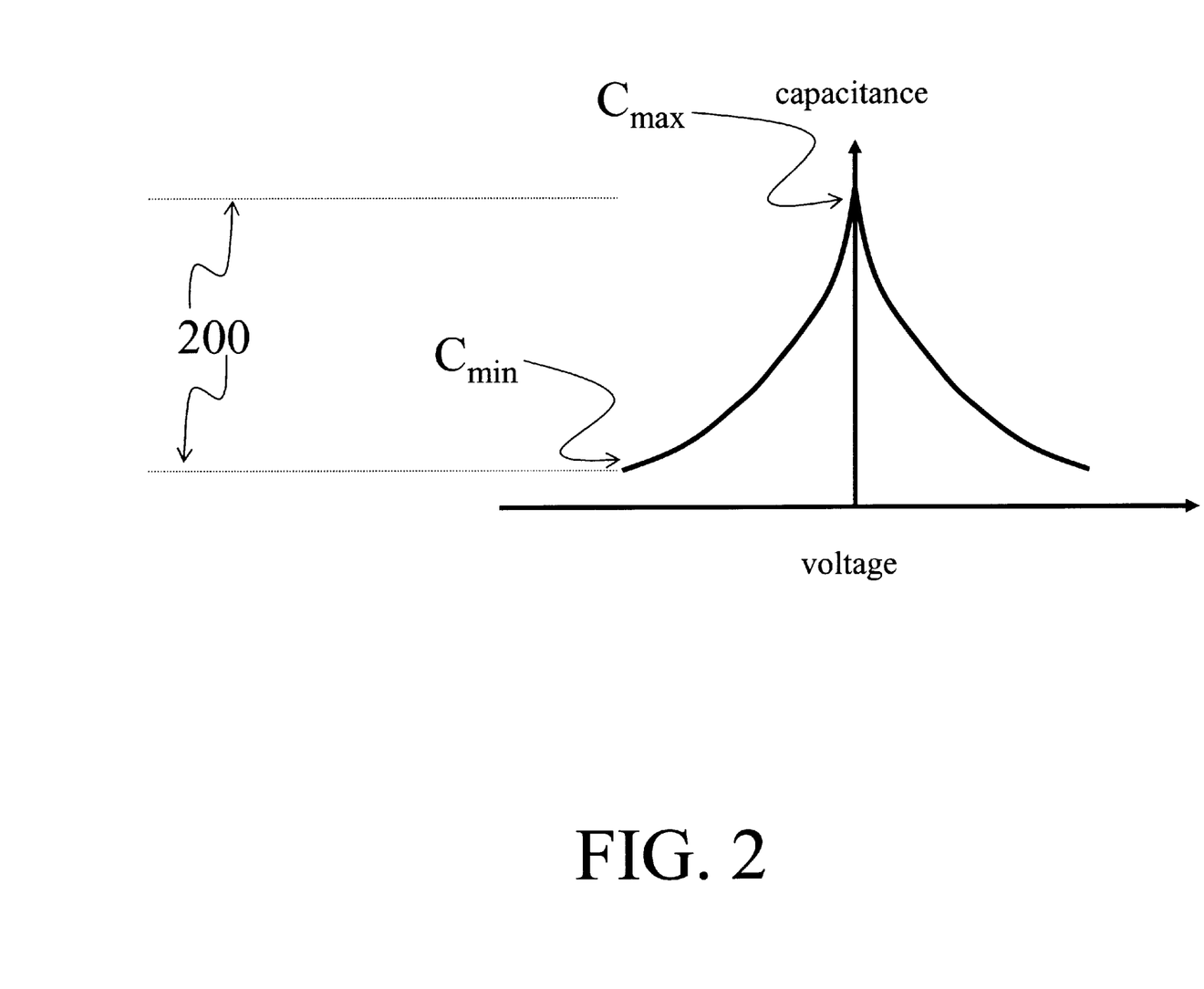
FIG. 2 shows a schematic C–V profile of the HBV.

The conduction band diagram of an HBV on an InP substrate is shown in FIG. 1. The structure essentially consists of a thin Aluminum-Arsenic (AlAs) layer 100 sandwiched between two thicker AlInAs layers 102 lattice matched to InP. Together they form a barrier between two n-type GaInAs electrodes 106 which are also lattice matched to InP. The Γ-point conduction band offset 108 has a value, in this case, of about 1.2 eV. Also shown is the Γ-point offset between GaInAs and AlInAs 110. A schematic C–V profile of the HBV is shown in FIG. 2. To maximize efficiency, it is desirable to minimize leakage current, maximize the breakdown voltage, and maximize the capacitance ratio, $C_{max}/C_{min}$ 200.

The leakage current is caused by electrons tunneling through the barrier and thermionic emission over the top of the barrier. For varactors with a low barrier height, such as GaAs/AlAs varactors, the large tunneling and thermionic currents severely restrict the range of voltage swing across the electrodes. This restriction reduces both the output power and conversion efficiency. Therefore the higher the blocking barrier, the better the performance of the device.

Figure 3:
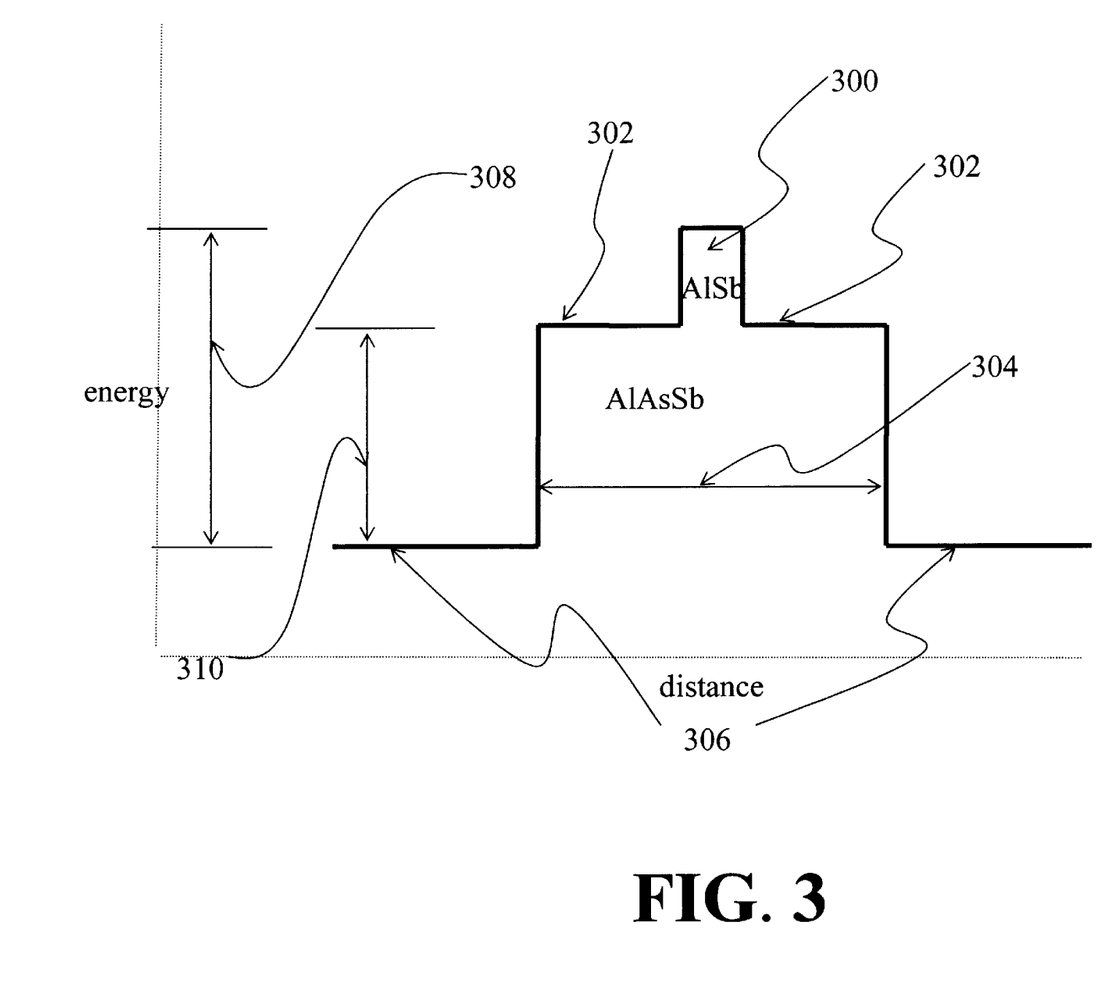
FIG. 3 shows the Γ-point conduction band offset of AlSb to GaInAs is approximately 2.0 eV, which is significantly higher than that of AlAs and GaInAs as depicted in FIG. 1.

One novel feature of the QHBV according to the present invention is the use of an Sb-based heterostructure barrier. As shown in FIG. 3, the Γ-point conduction band offset 308 of AlSb to GaInAs is approximately 2.0 eV, significantly higher than that of AlAs and GaInAs 110 (FIG. 1). Furthermore, this strained layer is sandwiched between two AlAs$_{0.56}$Sb$_{0.55}$ layers 302 which are lattice matched to InP, which also has a large conduction band offset 310 relative to GaInAs 306. The large barrier height of the Sb-based QHBV practically eliminates the leakage current due to the tunneling and thermionic emission, and the range of voltage swing is limited only by impact ionization; which is an intrinsic material limitation applicable to both HBVs and SDVs.

Figure 4:
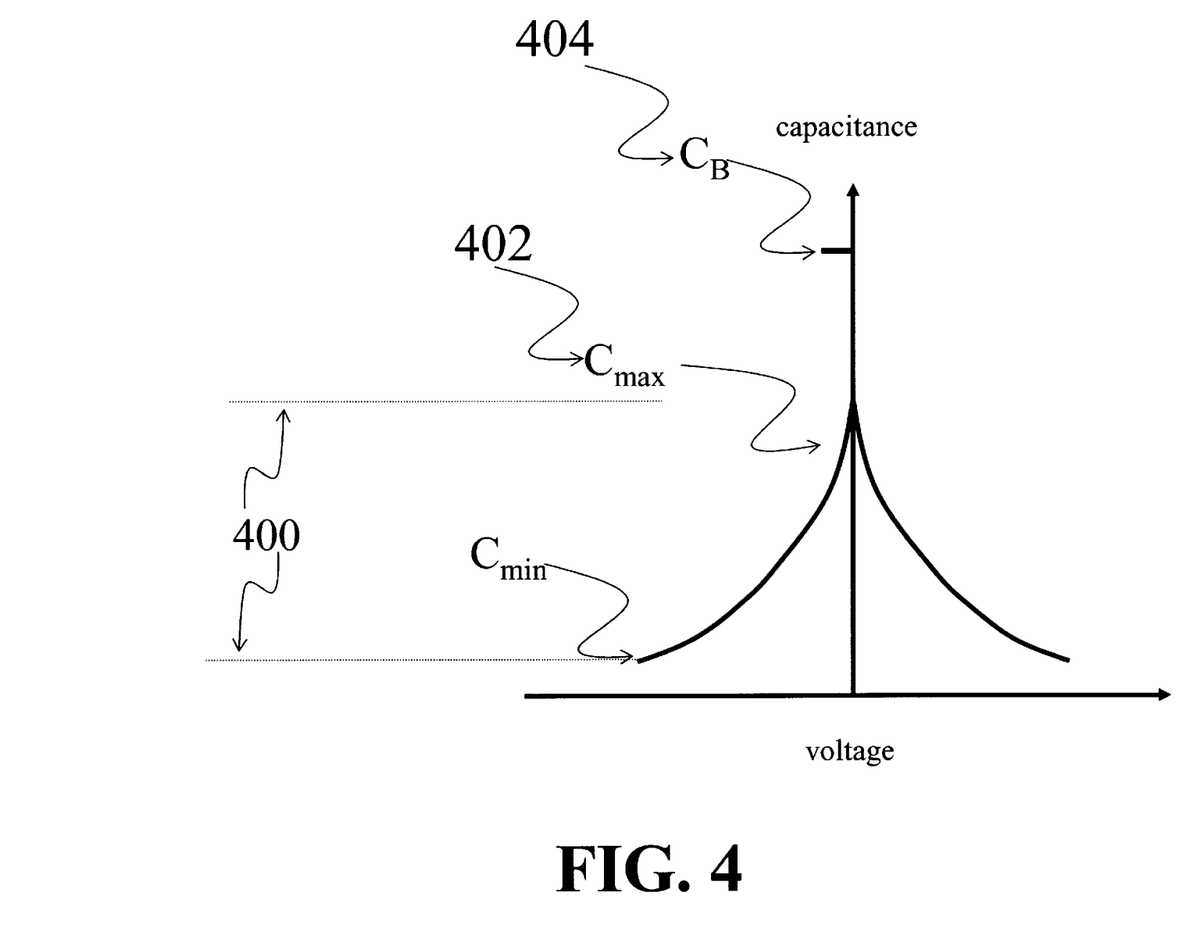
FIG. 4 shows a schematic C–V profile of the QHBV.

As shown in FIG. 4, he advantages of the large non-linearity in the C–V profile and the high $C_{max}/C_{min}$ ratio 400 of the conventional HBV are retained. Furthermore, for the same barrier width $L_B$ 104, 304 and doping concentration in the GaInAs electrodes 106, 306 the C–V profile will be the same. Yet, both the non-linearity and capacitance ratio may be increased further by implementing the bandgap engineered triangular quantum well cathode and anode disclosed herein.

Similar to the conventional HBV, $C_{min}$ is determined by the following equation:

$$C_{min} = \frac{\varepsilon \cdot A}{L_B + W_{Dmax}}, \qquad \text{Equation 1}$$

where A is the contact area;

ε the dielectric constant;

$L_B$ the barrier width; and $W_{Dmax}$ the maximum depletion width at the anode.

The last parameter is intrinsically limited by impact ionization breakdown, and depends on the doping concentration of the electrodes. Higher doping concentrations decrease $W_{Dmax}$ and increase $C_{min}$ which is undesirable. However, a low doping concentration will result in a large Debye screening length, which undesirably reduces the zero bias capacitance $C_{max}$, $$C_{max} = \frac{\varepsilon \cdot A}{L_B + 2L_S} = C_B \frac{1}{1 + \frac{2L_S}{L_B}} \qquad \text{Equation 2}$$

where $C_B = \varepsilon A/L_B$ is the geometrical limit of $C_{max}$.

Figure 5:
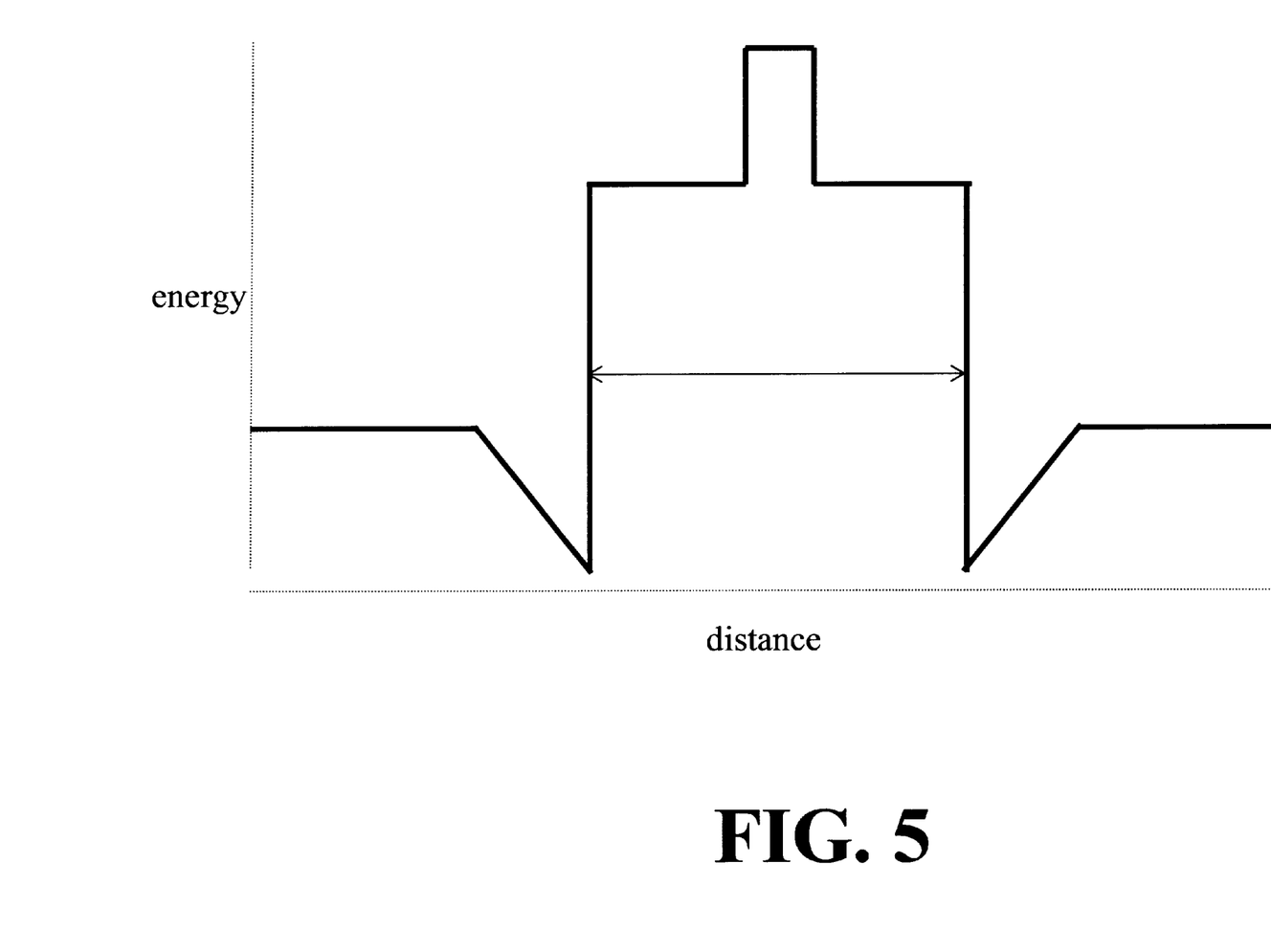
FIG. 5 shows the conduction band edge diagram of the QHBV at zero bias.
Figure 6:
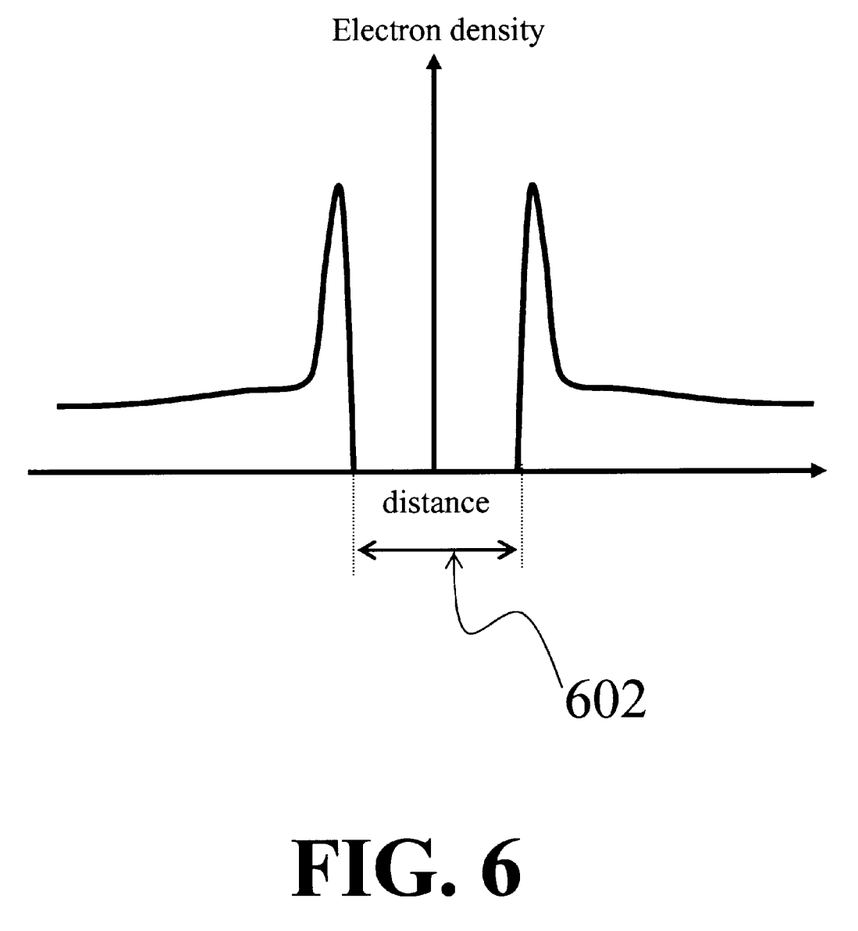
FIG. 6 schematically shows the electron density profile sharply peaking near the interface, resulting in a very short screening length.
Figure 7:
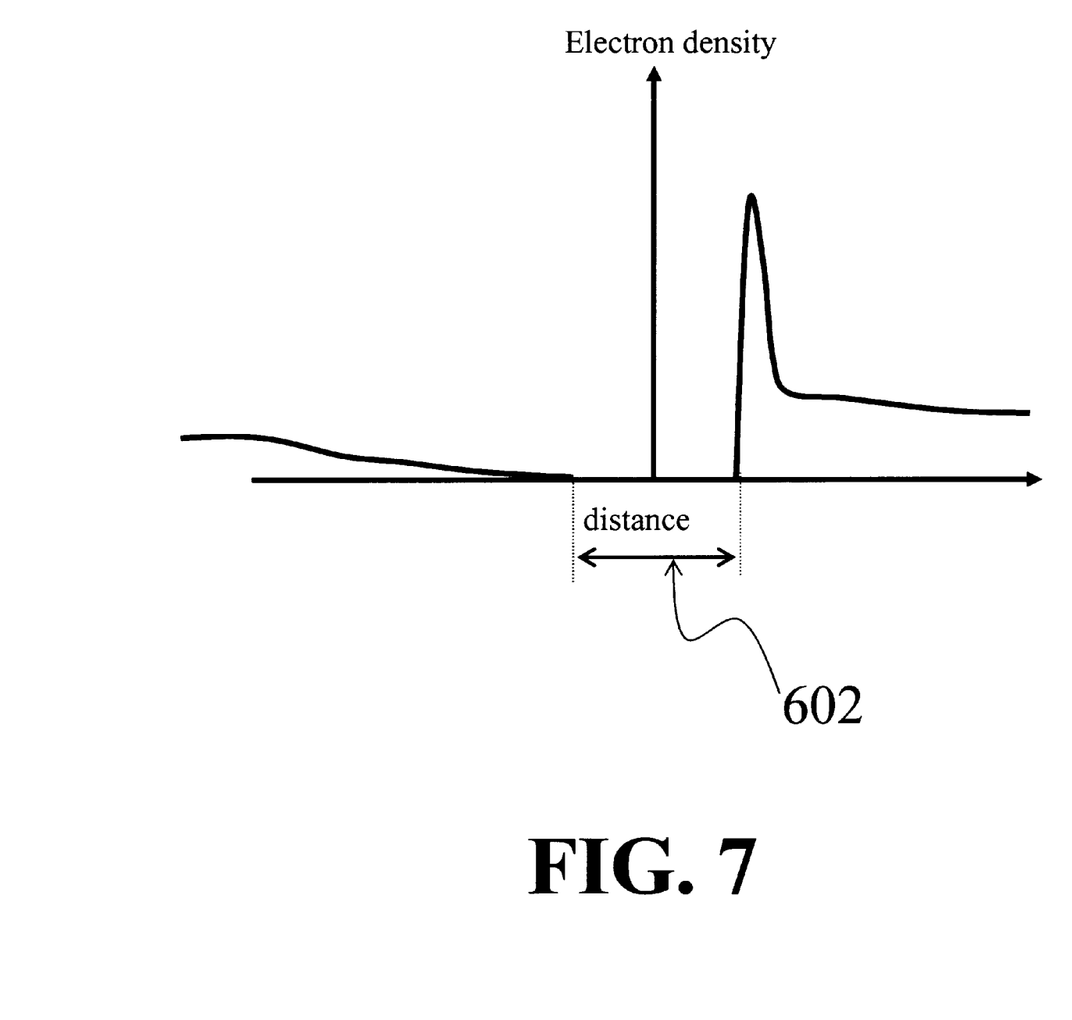
FIG. 7 schematically shows the electron density profile with an applied voltage.
Figure 8:
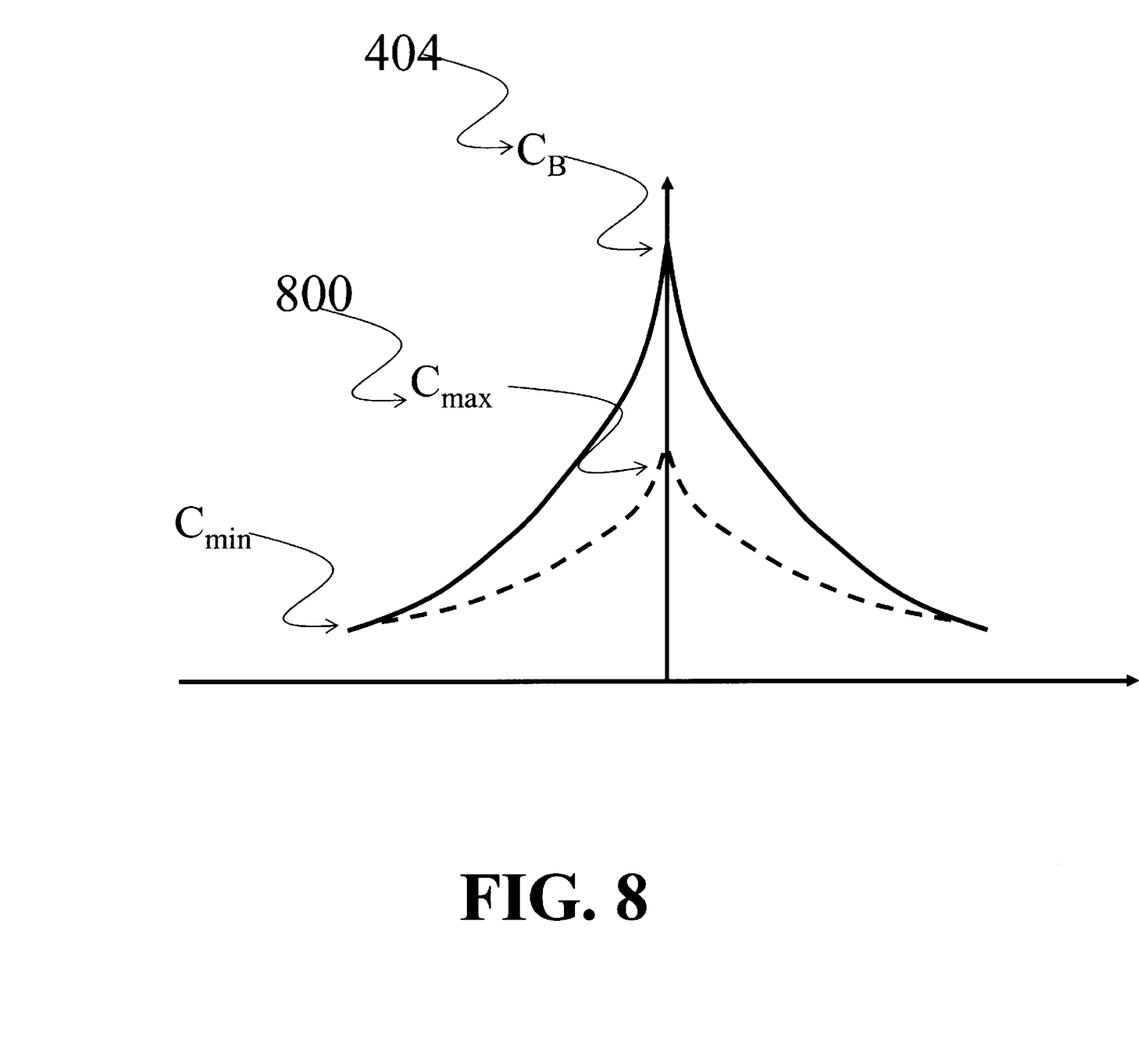
FIG. 8 shows a schematic C–V profile of the QHBV with and without an applied voltage.

Using a compositionally graded triangular quantum well to create a 2 dimensional electron gas (2DEG) at each heterointerface, it is possible to significantly reduce the screening length without having to raise the doping level in the electrodes. FIG. 5 shows the conduction band edge diagram of the QHBV at zero bias. Due to the presence of the 2DEG, the electron density profile at zero bias will peak sharply near the interface as shown schematically in FIG. 6 to result in very short screening length 602. As a result, the biased capacitance $C_{max}$ 402 can approach the geometrical limit $C_b$ 404 as shown in FIG. 4. This can also be accomplished using a square well, however, the triangular well has a critical advantage: The confinement of the well on the anode side will be quickly detuned by an applied voltage. The lack of quantum confinement will rapidly push the electrons away from the barrier as shown in the electron density profile in FIG 7. This change in electron density will cause a sharp drop in capacitance $C_{max}$ 800 vs $C_B$ 404 as shown in FIG. 8. The novel Sb-based heterostructure barrier together with the quantum well electrodes will result in a significantly more efficient varactor multiplier with higher output power.

Thus, a varactor diode capable of reducing the leakage current in frequency multipliers has been disclosed. The above described embodiments of the inventions are intended to be illustrative only. Numerous alternative embodiments may be devised by those skilled in the art without departing from the scope and spirit of the following claims.

What is claimed is:

1. An antimony-based quantum heterostructure barrier varactor diode wherein the diode is comprised of five layers, where the first layer is comprised of GaInAs, the antimony based heterojunction barrier is comprised of three of the layers, with the first barrier layer comprised of AlAsSb, the second barrier layer is comprised of AlSb, and the third barrier layer is comprised of AlAsSb, and wherein the fifth layer is comprised of GaInAs"whereby the layer structure of the varactor diode is provided to maximize the variation of capacitance with voltage at high frequencies".

2. The antimony-based triangular quantum well heterostructure barrier varactor diode of claim 1 wherein the varactor diode is configured to improve the efficiency of a frequency multiplier so as to decrease the power loss arising during the frequency multiplication.

3. The antimony-based triangular quantum well heterostructure barrier varactor diode of claim 1 wherein the varactor diode is optimized for application with frequency multipliers at providing outputs at submillimeter wave frequencies and above.

4. The antimony-based triangular quantum well heterostructure barrier varactor diode of claim 1 wherein the varactor is configured to provide decreased power losses resulting from frequency multiplication and improved efficiency in frequency multiplication circuits to frequency multipliers so as to decrease the power loss that arises during frequency multiplication.

5. The antimony-based triangular quantum well heterostructure barrier varactor diode of claim 1 wherein the antimony-based quantum well heterostructure barrier varactor diode has a reduced leakage current.

6. The antimony-based triangular quantum well heterostructure barrier varactor diode of claim 1 wherein electron tunneling through the heterojunction barrier and thermionic emission over the top of the heterojunction barrier are reduced.

7. The antimony-based triangular quantum well heterostructure barrier varactor diode of claim 1 eherein the large barrier height of the antimony-based quantum well heterojunction barrier substantially eliminates leakage current due to electron tunneling and thermionic emission.

8. The antimony-based triangular quantum well heterostructure barrier varactor diode of claim 1 wherein a compositionally graded triangular quantum well is provided to create a 2 dimensional electron gas at each heterointerface.

9. The antimony-based triangular quantum well heterostructure barrier varactor diode of claim 1 wherein the confinement of the well on the anode side is detuned by an applied voltage.

10. The antimony-based triangular quantum well heterostructure barrier varactor diode of claim 1 wherein the diode results in a more efficient varactor tripler with higher output power.

11. The antimony-based triangular quantum well heterostructure barrier varactor diode of claim 1, wherein the first layer and the fifth layer are graded proximate the heterojunction barrier to provide a pair of triangular quantum well electrodes.

* * * * *